(12) United States Patent
Muray et al.

(10) Patent No.: US 6,369,385 B1
(45) Date of Patent: Apr. 9, 2002

(54) INTEGRATED MICROCOLUMN AND SCANNING PROBE MICROSCOPE ARRAYS

(75) Inventors: Lawrence P. Muray, Moraga, CA (US); Ho-Seob Kim, Inchon (KR); T. H. Philip Chang, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/305,975

(22) Filed: May 5, 1999

(51) Int. Cl.⁷ ................................. H01J 37/28
(52) U.S. Cl. ...................... 250/306; 250/310
(58) Field of Search ................. 250/306, 307, 250/310

(56) References Cited

U.S. PATENT DOCUMENTS

| | | | |
|---|---|---|---|
| 4,874,945 A | * 10/1989 | Ohi | 250/306 |
| 5,015,850 A | 5/1991 | Zdeblick et al. | |
| 5,081,353 A | * 1/1992 | Yamada et al. | 250/306 |
| 5,126,574 A | 6/1992 | Gallagher | |
| 5,155,359 A | 10/1992 | Monahan | |
| 5,227,626 A | 7/1993 | Okada et al. | 250/234 |
| 5,229,607 A | * 7/1993 | Matsui et al. | 250/306 |
| 5,231,286 A | 7/1993 | Kajimura et al. | 250/234 |
| 5,333,495 A | * 8/1994 | Yamaguchi et al. | 250/306 |
| 5,345,815 A | 9/1994 | Albrecht et al. | 73/105 |
| 5,510,615 A | * 4/1996 | Ho et al. | 250/306 |
| 5,581,082 A | 12/1996 | Hansma et al. | 250/306 |
| 5,618,760 A | 4/1997 | Soh et al. | 438/703 |
| 5,689,063 A | 11/1997 | Fujiu et al. | 73/105 |

FOREIGN PATENT DOCUMENTS

| | | |
|---|---|---|
| EP | 0531779 A1 | 3/1993 |

OTHER PUBLICATIONS

E. S. Snow and P. M. Campbell, "Fabrication of Si nanostructures with an atomic force microscope," Appl. Phys. Lett., vol. 64, No. 15, Apr. 11, 1994, pp. 1932–1934.

E.S. Snow, P.M. Campbell, and P. J. McMarr, "Fabrication of silicon nanostructures with a scanning tunneling microscope," Appl. Phys. Lett. 63 (6), Aug. 9, 1993, pp. 749–751.

Christie R. K. Marrian, Elizabeth A. Dobisz and John A. Dagata, "Low Voltage E–Beam Lithography With The STM," Technology of Proximal Probe Lithography, pp. 58–73.

Dawen Wang, Liming Tsau and K.L. Wang, "Nanometer–structure writing on Si(100) surfaces using a non–contact–mode automic force microscope," Appl. Phys. Lett 65 (11), Sep. 12, 1994, pp. 1415–1417.

H. J. Mamin and D. Rugar, "Thermomechanical writing with an atomic force microscope tip," Appl. Phys. Lett. 61 (8), Aug. 24, 1992, pp. 1003–1005.

(List continued on next page.)

Primary Examiner—Kiet T. Nguyen
(74) Attorney, Agent, or Firm—Jung-hua Kuo (57) ABSTRACT

An apparatus for surface inspection and processing of a wafer includes a microcolumn and an associated scanning probe microscope. The microcolumn enables high speed scanning of the wafer at a relatively high resolution, while the scanning probe microscope provides atomic resolution of highly localized areas of the wafer. The microcolumn and scanning probe microscope can be partially fabricated out of the same substrate. Additionally, the microcolumn and scanning probe microscope can be a portion of an array of microcolumns and/or scanning probe microscopes. The apparatus may be used for imaging, lithography and spectroscopy.

28 Claims, 7 Drawing Sheets

OTHER PUBLICATIONS

A. Majumdar, P. I. Oden, J. P. Carrejo, L. A. Nagahara, J. J. Graham and J. Alexander, "Nanometer–scale lithography using the atomic force microscope," Appl. Phys. Lett. 61 (19), Nov. 9, 1992, pp. 2293–2295.

Chang et al., "Electron Beam technology—SEM to microcolumn," Sep. 1996, Microelectronic Engineering vol. 32, No. 1, p. 113–130.

Ehrichs et al., "A scanning tunneling microscope/scanning electron microscope system for the fabrication of nanostructures," Mar. 1, 1992, Journal of Vacuum Science and Technology: Part B, US, American Institute of Physics, New York, vol. 9, No. 2 Part 02, p. 1380–1383.

* cited by examiner

INTEGRATED MICROCOLUMN AND SCANNING PROBE MICROSCOPE ARRAYS

BACKGROUND OF THE INVENTION

1. Field of the Invention

The present invention relates to electron beam technology. More particularly, the present invention relates to an apparatus including a microcolumn and a scanning probe microscope for surface inspection and microfabrication.

2. Description of the Related Art

The recent trend in electron beam technology is toward low voltage scanning electron microscopy. Low voltage scanning electron microscopy has applications in surface inspection, metrology, testing and lithography.

Conventional scanning electron microscopes (SEMs) are large immobile devices. Although SEMs have many applications, such as semiconductor-related inspection and testing, conventional SEMs are limited in their usefulness because of their size, immobility and associated costs. For instance, because the sample being observed, as opposed to the SEM, must be moved during the inspection process, a conventional SEM requires the use of a vacuum chamber that is much larger than the sample. Further, the sample must be positioned at an angle relative to a conventional SEM to produce a beam incidence angle required for three-dimensional-like surface feature imaging. This makes handling of large or delicate samples difficult. Moreover, throughput of a conventional SEM is limited because only one microscope can observe a sample at a time.

An effort to improve SEMs has resulted in miniature electron beam microcolumns ("microcolumns"). Microcolumns are based on microfabricated electron optical components and field emission sources operating under the scanning tunneling microscope (STM) feedback principle. Microcolumns are discussed in general in T. H. P. Chang et al., "Electron Beam Technology—SEM to Microcolumn," 32 *Microelectronic Engineerng* 113–30 (1996) and T. H. P. Chang et al., "Electron-Beam Microcolumns for Lithography and Related Applications," B 14(6) *Journal of Vacuum Science Technology* 3774–81 (November/December 1996), which are incorporated herein by reference.

Although microcolumns provide high resolution at a high scanning speeds, they are unable to provide atomic resolution. Information at the atomic level, such as spectroscopy or topography, may be necessary for in-line quality control or registration in microfabrication. In addition, for lithography, microcolumns are limited in their ability to write very small features. Thus, it would be advantageous to provide an apparatus having a wider range of resolution than that of a microcolumn and capable of writing atomic-scale features.

SUMMARY

The present invention addresses these problems by combining a microcolumn and a scanning probe microscope in a single apparatus. The apparatus provides a greater range of resolution and scan area size than either the microcolumn or scanning probe microscope alone. In addition, the small size of the apparatus makes it suitable for use in confined spaces. This versatile apparatus has applications in the areas of imaging, lithography and spectroscopy.

In accordance with one aspect of the invention, an apparatus for surface inspection or microfabrication of a wafer includes a microcolumn and an associated scanning probe microscope. Both may be mounted on a single support structure. The scanning probe microscope, which, for example, can be a scanning tunneling microscope or an atomic force microscope, provides atomic resolution of features on the wafer, while the microcolumn allows coarse rapid scanning of the overall sample.

In accordance with another aspect of the invention, an apparatus for surface inspection or microfabrication of a wafer includes an array of microcolumns and at least one scanning probe microscope. The at least one scanning probe microscope is associated with at least one microcolumn in the array of microcolumns to provide atomic resolution of features on the wafer.

In accordance with still another aspect of the present invention, a method for inspecting or patterning a wafer includes providing an array that includes multiple microcolumns and at least one scanning probe microscope and placing the array above the wafer such that each microcolumn of the array of microcolumns is situated above a respective die of the wafer. The method further includes inspecting or patterning the dice of the wafer or selectively exposing patterns on the dice with the microcolumns. The scanning probe microscope precisely positions the array above the wafer and/or patterns and inspects atomic-scale features on the dice. The simultaneous operation provides a fast inspection or lithography process.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
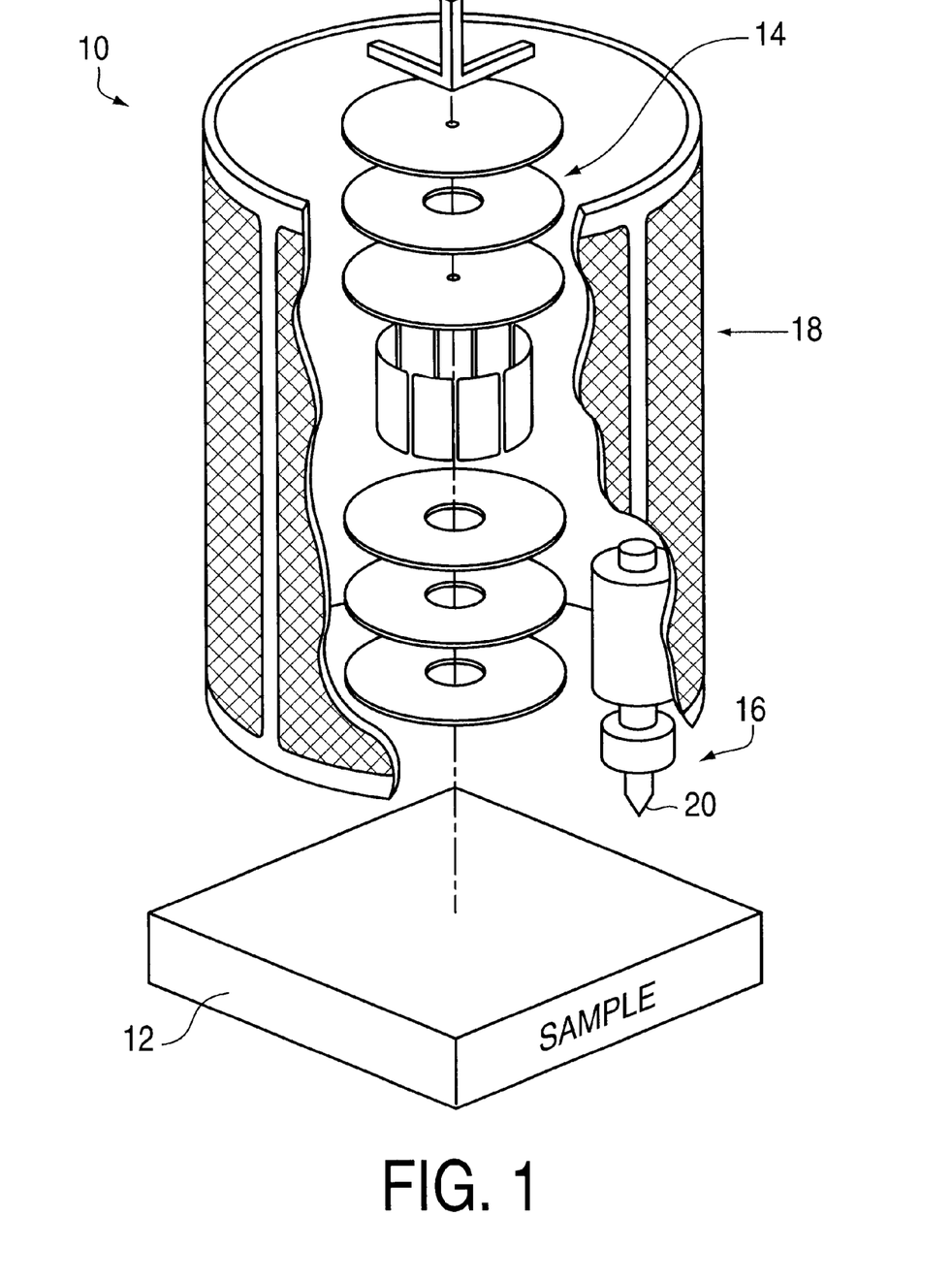
FIG. 1 is a perspective view of an apparatus, in accordance with one embodiment of the present invention, including a microcolumn and a scanning probe microscope positioned over a sample.

FIG. 1 illustrates an apparatus 10 in accordance with the present invention, positioned above a semiconductor wafer or sample 12. Apparatus 10 includes a microcolumn 14 and a scanning probe microscope 16, both mounted on a support structure 18. Support structure 18 may include a three-dimensional piezoelectric driver (not shown) for moving microcolumn 14 and scanning probe microscope 16 with respect to sample 12. The combination of microcolumn 14 (and an associated electron detector) and scanning probe microscope 16 provides a broad range of resolution in apparatus 10, for which there are many applications. Microcolumn 14 has a fast scan rate, enabling it to quickly scan and with its associated conventional detector provide information about sample 12. However, microcolumn 14 is unable to provide extremely high resolution of the sample, since the microcolumn remains relatively far away from the sample during the scanning process. A typical working distance between the tip of microcolumn 14 and sample 12 is about 1 mm. On the other hand, scanning probe microscope 16 has a probe tip 20 which is within nanometers of the surface of sample 12 to provide extremely high resolution of sample 12. As will be discussed in greater detail below, various scanning probe microscopes 16, including scanning tunneling microscopes (STMs), atomic force microscopes (AFMs), or magnetic force microscopes (MFMs), can be used. Scanning probe microscope 16, whose probe tip 20 mechanically scans across the surface of sample 12, conventionally provides information at or near the atomic level of sample 12. This information may be topographic, spectroscopic or magnetic. However, scanning probe microscope 16 requires mechanical scanning across the surface of sample 12 and thus operates much more slowly than microcolumn 14, which electrically scans an electron beam along the surface. The integration of microcolumn 14 and scanning probe microscope 16 produces a versatile apparatus 10, which may be used in many applications, such as imaging, lithography and spectroscopy.

Figure 2:
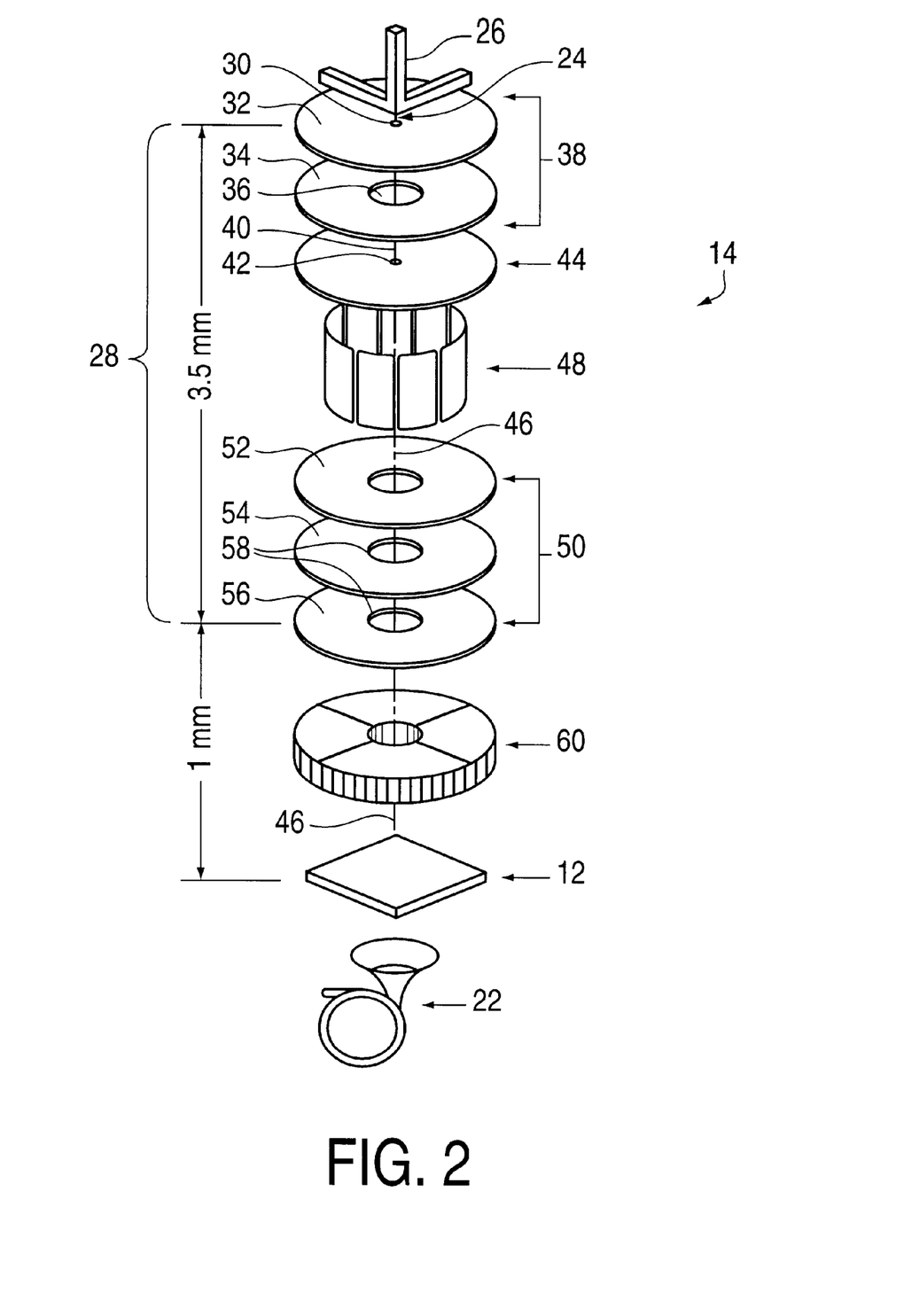
FIG. 2 is an exploded perspective view of the microcolumn of FIG. 1.

FIG. 2 in an exploded view illustrates microcolumn 14 positioned over sample 12 with an associated channeltron electron detector 22 located under sample 12. Sample 12 is on a suitable support (not shown). Detector 22 can generate scanning transmission election microscope (STEM) images when sample 12 is transparent to electrons. Microcolumn 14 includes an electron source (not shown), which may be a miniature cold-field or Schottky emitter, having a field emitter tip 24. Tip 24 may be a cold-field emitter tip, such as a single crystal tungsten, hafnium carbide or diamond tip, or a Zr/O/W Schottky-type emitter tip. Tip 24 is preferably mounted on a positioner 26, such as a three-axis STM-type X-Y-Z positioner. Positioner 26 has a range of movement on the order of 10 $\mu$m up to about 1 mm along each axis. Positioner 26 has a nanometer scale positioning accuracy capability and is utilized to align tip 24 with an electron optical column 28. Column 28 includes the various depicted components. Column 28 has a length of about 3.5 mm.

For purposes of example, tip 24 is aligned with a 5 $\mu$m diameter aperture 30 in an extractor 32. Extractor 32 is combined with an anode 34, having an aperture 36 on the order of 100 $\mu$m in diameter to form a selectively scaled dual electrode source 38. Source 38 directs a resulting electron beam 40 to a beam limiting aperture 42 in an aperture member 44. Aperture 42, which is on the order of several microns, is illustrated as 2.5 $\mu$m in diameter. The spacing and aperture size selected determine the convergence of an electron beam 46 at sample 12.

From aperture 42, electron beam 46 passes through a beam deflector 48. Beam deflector 48 may be a single unit or a multiple unit octupole scanner/stigmator. Deflector 48 deflects or scans beam 46 across sample 12. A multiple electrode Einzel lens 50 focuses beam 48 onto sample 12 at a working distance of 1–2 mm. Lens 50 may, for example, include three electrodes 52, 54 and 56, each having an aperture 58 with a diameter on the order of 200 $\mu$m.

Microcolumn 14 optionally includes an electron detector 60 that detects electrons scattered upwards from sample 12. Detector 60 may be a microchannel plate electron detector for secondary and backscattered electrons or a metal-semiconductor detector for low energy backscattered electrons. Microcolumn 14 operates to produce beam 46 with typical electron energies ranging e.g. from 50 eV to 5 keV, suitable for inspection and imaging FIG. 2 illustrates merely one example of many possible field emission sources and electron optical columns that may be utilized in microcolumn 14. For additional examples of field emission sources and electron optical columns suitable for microcolumn 14, see the following articles and patents: E. Kratschmer et al., "Experimental Evaluation of a 20×20 mm Footprint Microcolumn," B 14(6) *Journal of Vacuum Science Technology* 3792–96 (November/December 1996); "Electron-Beam Sources and Charged-Particle Optics," 2522 *SPIE* 4–12 (1995); M. G. R. Thompson et al., "Lens and Deflector Design for Microcolumns," 13(6) *Journal of Vacuum Science Technology* 2245–49 (November/December 1995); H. S. Kim et al., "Miniature Schottky Electron Source," 13(6) *Journal of Vacuum Science Technology* 2468–72 (November/December 1995); U.S. Pat. No. 5,122,663 to Chang et al.; and U.S. Pat. No. 5,155,412 to Chang et al., all of which are incorporated herein by reference.

Figure 3:
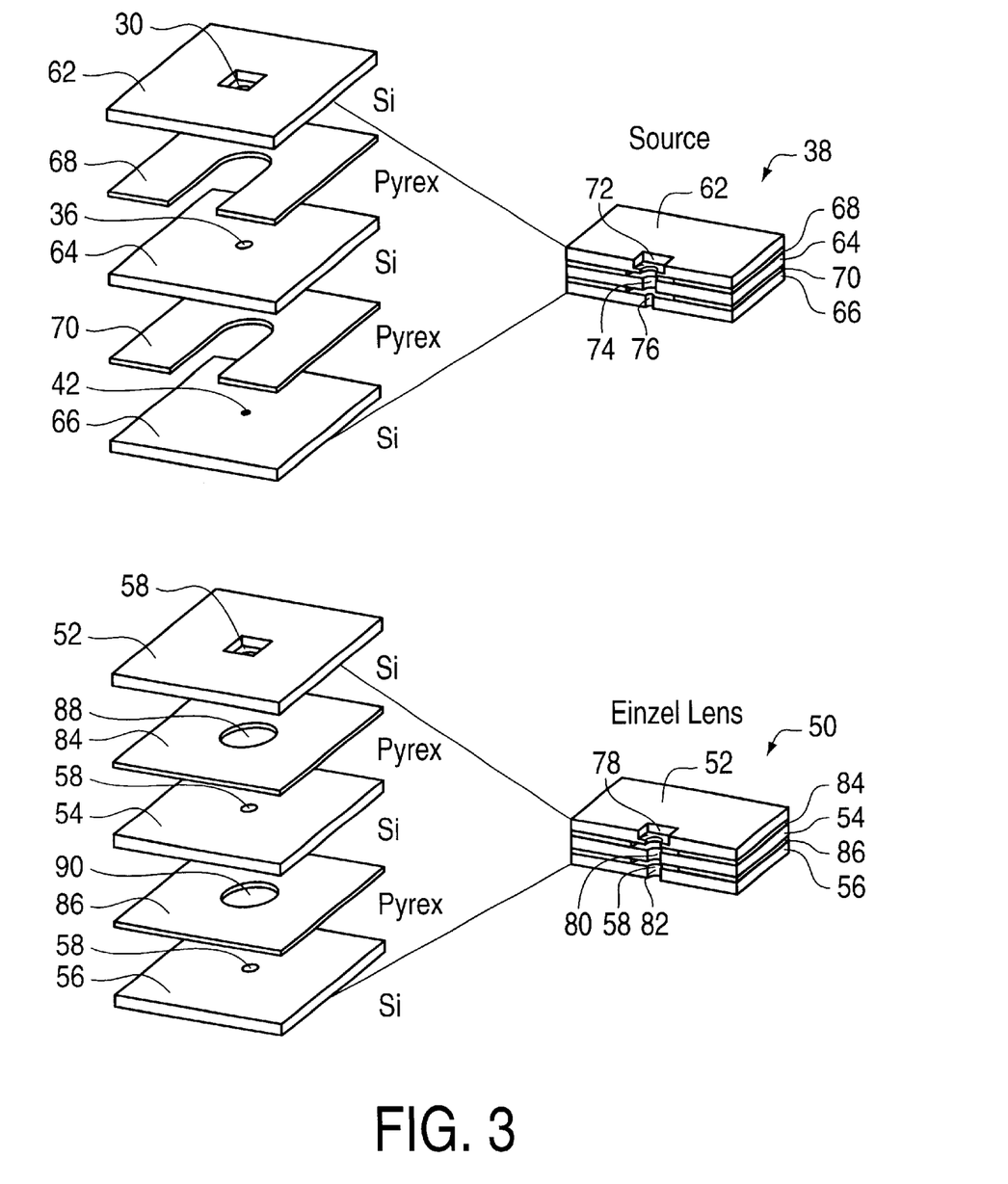
FIG. 3 is an exploded perspective view of a microcolumn source and microlens for the microcolumn of FIGS. 1 and 2.

FIG. 3 illustrates one example of the construction of source lens 38 and Einzel lens 50. For additional fabrication details, see K. Y. Lee et al., "High Aspect Ratio Aligned Multilayer Microstructure Fabrication," 12(6) *Journal of Vacuum Science Technology* 3425–30 (November/December 1994), also incorporated herein by reference. Source 38 includes a plurality of silicon wafers or chips 62, 64 and 66, which are spaced apart by 100–500 $\mu$m thick insulating layers 68 and 70. Layers 68 and 70, which are not drawn to scale, are generally formed from glass, such as PYREX™. To form source 38, chips 62, 64 and 66 and layers 68 and 70 are precisely aligned and bonded together, typically by electrochemical anodic bonding.

Prior to the bonding process, electron beam lithography and reactive-ion etching form respective silicon membranes 72, 74 and 76 in silicon chips 62, 64 and 66. Membranes 72, 74 and 76 are on the order of 1–2 $\mu$m thick. The required beam apertures, such as apertures 78, 80 and 82 are then formed in membranes 72, 74 and 76, respectively. Membranes 72, 74 and 76 and apertures 30, 36 and 42 form elements 32, 34 and 44 of source lens 38.

Electrodes 52, 54 and 56 of Einzel lens 50 include similarly formed central silicon membranes 78, 80 and 82 with apertures 58. Einzel lens 50 further includes PYREX™ insulating layers 84 and 86 with apertures 88 and 90, respectively. Apertures 88 and 90 are larger than apertures 58. Membranes 78, 80 and 82 and layers 84 and 86 are aligned and typically bonded together to form Einzel lens 50.

Figure 4:
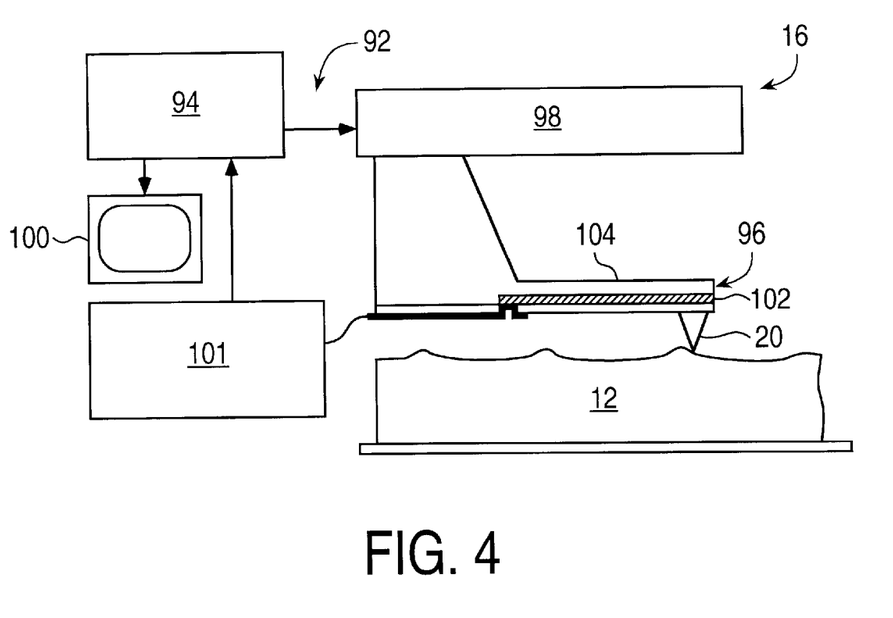
FIG. 4 is a conceptual block diagram of the scanning probe microscope of FIG. 1.

Scanning probe microscope 16 of apparatus 10 is conceptually illustrated in FIG. 4. Scanning probe microscope 16 utilizes a conventional feedback system 92, including a controller 94, to monitor and control a probe 96, a mechanical scanning system 98, and a display system 100. Mechanical scanning system 98 moves probe 96 of scanning probe microscope 16 over sample 12 during a mechanical scanning operation, and display system 100 displays information about the surface of the sample. Extending down from one end of probe 96 is probe tip 20 whose movement is typically controlled by a piezoelectric control circuit 101. Further details of scanning probe microscopes may be found in U.S. Pat. No. 5,231,286, entitled "Scanning Probe Microscope Utilizing an Optical Element in a Waveguide for Dividing the Center Part of the Laser Beam Perpendicular to the Waveguide" which is incorporated herein by reference in its entirety. As discussed above, scanning probe microscope 16 provides resolutions down to atomic-scales, enabling individual atoms to be viewed. Resolution of scanning probe microscope 16 ranges from the sub-nanometer level, e.g. 0.1 nm, to the micrometer level. Any scanning probe microscope, such as a STM, AFM or MFM, may be used in conjunction with microcolumn 14 to image sample 12. STMs and AFMs may also be used for applications in lithography, and STMs may further be used for spectroscopy.

STMs employ quantum tunneling effects to image features of a sample. For a STM, probe tip 20 is electrically conductive, and as probe tip 20 is raster-scanned across the surface of sample 12, a control voltage is applied to a piezoelectric crystal 102, so that the value of a tunnel current flowing between probe tip 20 and sample 12 remains constant. Since the tunnel current depends on the distance between probe 96 and sample 12, piezoelectric crystal 102 displaces probe tip 20 in accordance with the surface of sample 12. Image data corresponding to the displacement of probe tip 20 is determined from the control voltage applied to the piezoelectric body to keep the tunnel current constant. Because the tunnel current flows across a gap between probe tip 20 and the sample surface only when there is a potential difference between the two, STMs are limited to applications in which the surface of the sample conducts electrons.

STMs are capable of writing patterns on a sample. In particular, in one method of lithography, a tunnel current is selectively applied between probe tip 20 of the STM and sample 12, while a gas is supplied to sample 12. Only the portion of sample 12 on which the tunneling current flows adsorbs atoms or molecules from the gas. Thus, the desired amount and pattern of atoms or molecules can be deposited on sample 12, and the resolving power of the electron beam determines the minimum feature size in the pattern. The diameter of probe tip 20, which controls the resolving power, can be as small as 1 nm. Other techniques involved direct low-voltage exposure of the resist material by the tunneling electrons. Removal of material from sample 12 can also be performed with the STM. Thin film may be etched with the resolving power of the beam as determined by the diameter of probe tip 20. An example of lithography using STMs is provided in U.S. Pat. No. 5,227,626, entitled "Lithography Apparatus Using Scanning Tunneling Microscopy," which is incorporated herein by reference.

In addition, STMs may be used for spectroscopy. Since STMs apply a current at a selectable voltage, STMs are capable of providing information as to the band structure, surface states, bonding energies and atomic composition of very localized areas of the sample.

AFMs provide a three-dimensional image of a sample surface and are not limited to samples with electrically conductive surfaces. Thus, imaging and lithography using AFMs may be applied to insulators. AFMs operate by bringing probe 96, which is mounted on a flexible cantilever 104, into contact with sample 12 and measuring the deflection of cantilever 104 as it is scanned across the surface of sample 12. As probe tip 20 passes over sample 12, interatomic forces from sample 12 are exerted on and deflect probe tip 20 by a distance corresponding to the magnitude of the force. Cantilever 104 includes piezoelectric crystal 102, which is feedback controlled to maintain the cantilever's displacement constant. The voltage applied to cantilever 104 changes in conjunction with the surface configuration of sample 12, and an image of the surface of sample 12 is generated based on the applied voltage information.

Cantilever 104 of AFM may be made by silicon micromachining techniques, which enable cantilever 104 to have a small spring constant and a high resonant frequency. Probe tip 20 is mounted at a free end of cantilever 104. A typical AFM probe tip is a standard $Si_3N_4$ pyramidal tip, such as manufactured by Park Scientific Instruments, and has an 80 nm tip diameter. For lithographic applications, for example, 30 nm of Ti is deposited onto probe tip 20. AFMs can write patterns on a sample by exposing an H-passivated Si surface of the sample to an electric field generated by probe tip 20 to oxidize certain regions. This process is further described in E. S. Snow et al., "Fabrication of Si Nanostructures with an Atomic Force Microscope," 64(15) Appl. Phys. Lett. 1932–34 (Apr. 11, 1994), which is incorporated herein by reference.

Finally, a MFM has a construction similar to that of an AFM. Probe 96 of a MFM is formed of a magnetic material. Accordingly, the MFM produces an image of the sample surface by utilizing the magnetic force acting between probe tip 20 and magnetic particles on the surface of the sample.

Figure 5:
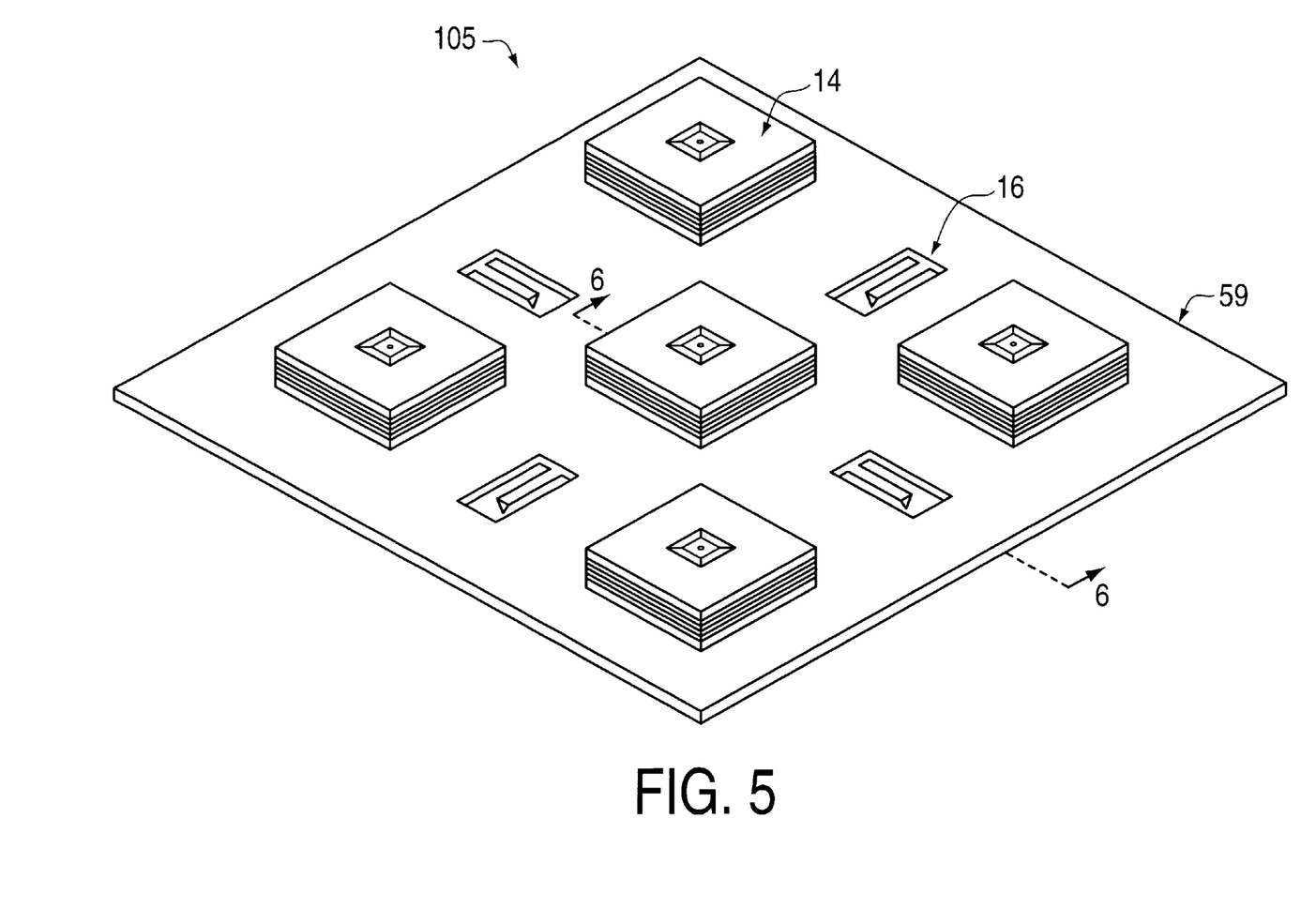
FIG. 5 is a perspective view of an apparatus in accordance with an alternative embodiment of the present invention showing an array of microcolumns and scanning probe microscopes.
Figure 6:
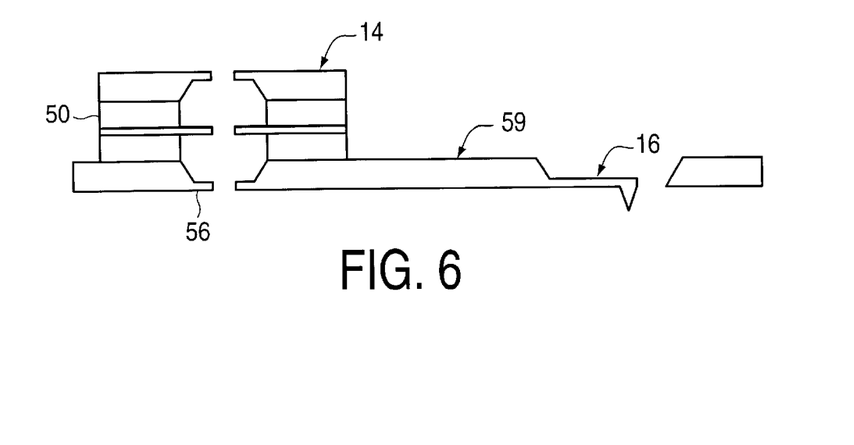
FIG. 6 is an enlarged, partial cross-sectional view taken generally along the line 6—6 of FIG. 5.

Microcolumn 14 and scanning probe microscope 16 are preferably micromachined from crystalline silicon as a single unit of apparatus 10. FIG. 5 illustrates an alternative embodiment showing apparatus 105 in which an array of microcolumns 14 and the probe portion of scanning probe microscopes 16 is fabricated on a single common grounded electrode 59. FIG. 6 provides an enlarged, partial cross-sectional view of a portion of apparatus 105, illustrating how electrode 59 serves both as the substrate material for the probe portion of scanning probe microscopes 16 and as electrode 56 of Einzel lenses 50 of microcolumns 14 and scanning probe microscopes 16. Fabrication of the scanning probe microscopes 16 are performed on electrode 59 using conventional techniques with the addition of patterned holes for electrodes 56 of microcolumns 14. In parallel, microcolumns 14 are fabricated, using previously described methods, without electrodes 56 of Einzel lenses 50. The two sub-assemblies are then aligned and bonded together using, for example, anodic bonding or laser bonding techniques. The accuracy of this integrated apparatus is limited only by the alignment accuracy of the bonding system. Since both the microcolumn's final electrode and scanning probe microscope operate at ground potential, no isolation between the them is required. The remainder of microcolumns 14 and scanning probe microscopes 16 is formed conventionally.

In the alternative, microcolumns 14 and scanning probe microscopes 16 are manufactured separately and then assembled in support structure 18 of FIG. 1. This, however, requires proper alignment between microcolumns 14 and scanning probe microscopes 16. Apparatus 10 may be as small as 100 μm×100 μm, if micromachined, or as large as 1 cm×1 cm. A small size is advantageous as it enables apparatus 10 to operate in a confined space, such as in a chamber containing an ultra high vacuum, with very high mechanical stability.

Apparatus 10 provides a greater range of resolution than either microcolumn 14 or scanning probe microscope 16 alone and may be used for a larger number of applications. Microcolumn 14 of apparatus 10 provides high speed, two-dimensional imaging of a relatively large surface area of sample 12, while scanning probe microscope 16 provides greater detailed, localized information, such as topographic, spectroscopic, or magnetic information. In addition, microcolumn 14 can be used to pattern larger areas of sample 12, while scanning probe microscope 16 patterns atomic-scale features on sample 12. The combination of microcolumn 14 and scanning probe microscope 16 in apparatus 10 also allows for in-line quality control, thereby resulting in higher throughput lithography.

Figure 7:
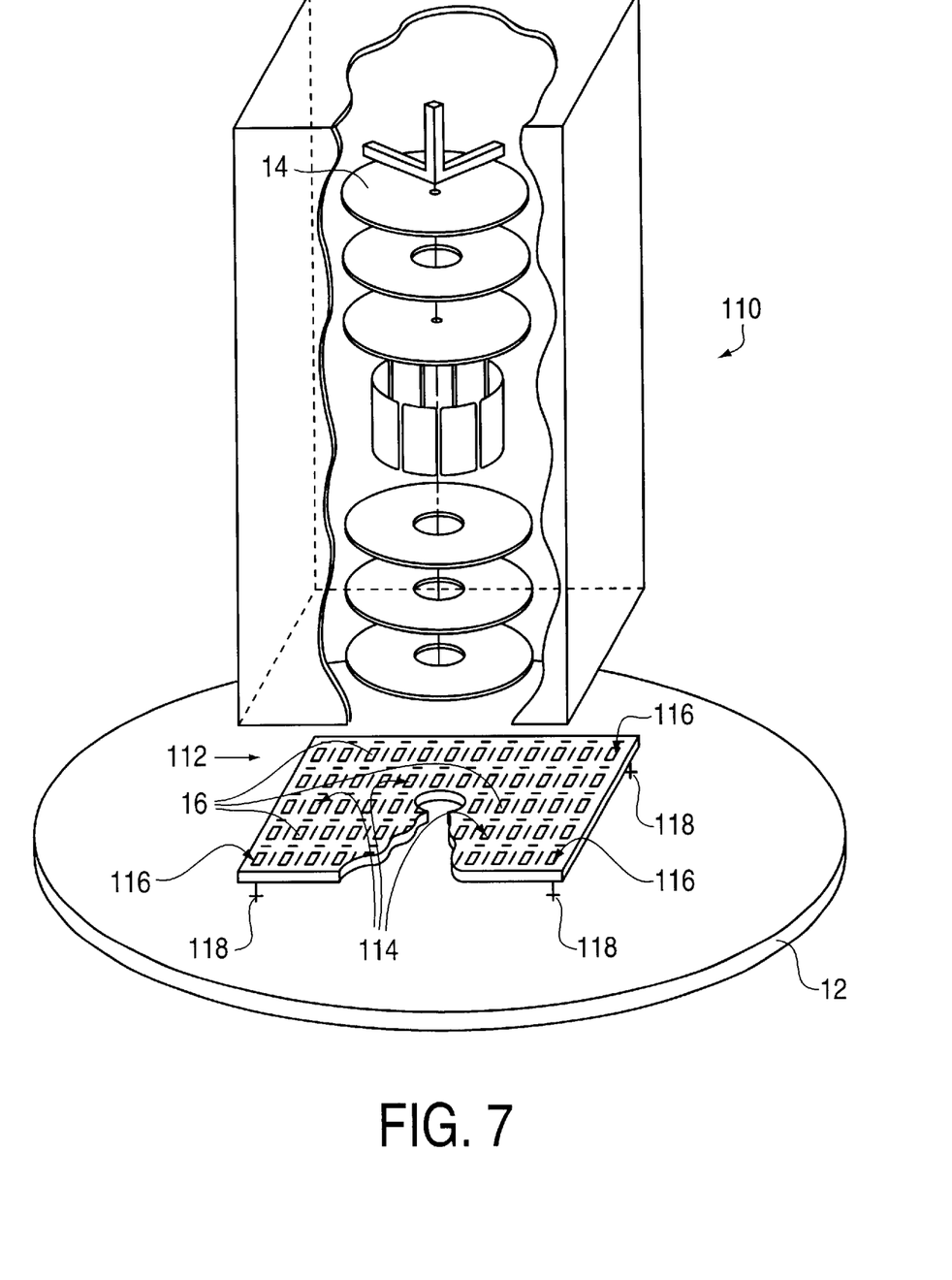
FIG. 7 is a perspective view of an apparatus in accordance with another alternative embodiment of the present invention showing a microcolumn and an associated array of scanning probe microscopes.

Referring now to FIG. 7, another alternative embodiment of the present invention is depicted positioned above sample 12. In FIG. 7, an apparatus 110 includes an array 112 of scanning probe microscopes 16 associated with a single microcolumn 14. Microcolumn 14 and array 112 of probes of scanning probe microscopes 16 can operate simultaneously over sample 12. In an exemplary embodiment, scanning probe microscopes 16 at the center of array 112 are STMs 114, and scanning probe microscopes 16 along the periphery of array 112 are AFMs 116. Peripheral AFMs 116 can provide non-destructive sub-nanometer measurement of the position of apparatus 110 with respect to alignment targets 118 on sample 12. The measurement can be used to position apparatus 110 above sample 12, where central STMs 114 could be used to write atomic-scale devices on sample 12, while microcolumn 14 writes interconnects and pads.

Figure 8:
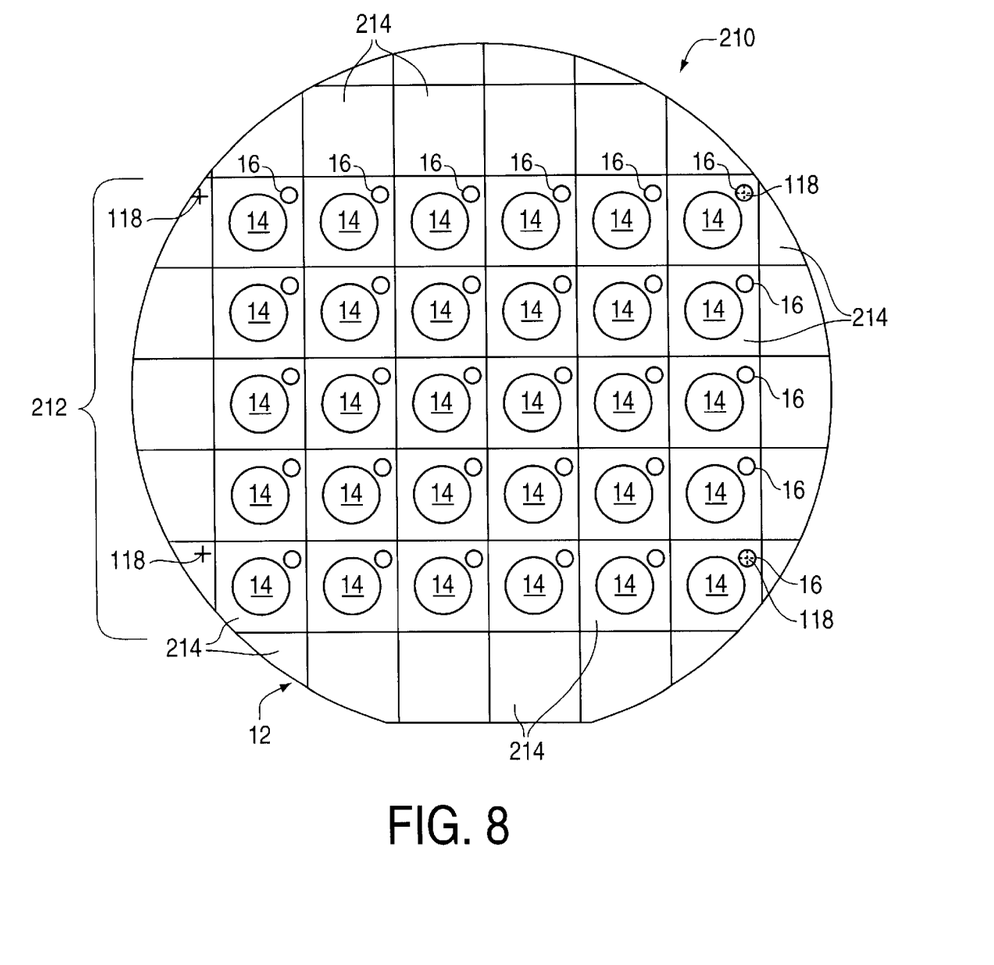
FIG. 8 is a schematic top view of an apparatus in accordance with still another alternative embodiment of the present invention showing an array of microcolumns and associated scanning probe microscopes.

FIG. 8 illustrates in a plan view yet another alternative embodiment of the invention. Apparatus 210 includes an array 212 of microcolumns 14, with each microcolumn 14 having at least one scanning probe microscope 16 associated therewith. An array of scanning probe microscopes, as in FIG. 7, may also be provided for each microcolumn 14. In FIG. 8, sample 12 is a wafer having a plurality of dice 214. Apparatus 210 is positioned above wafer 12 such that each microcolumn 14 and its associated scanning probe microscope 16 or array of scanning probe microscopes is above a respective die 214 of wafer 12. Apparatus 210 with array 212 of microcolumns 14 provides high throughput lithography, because multiple patterns can be simultaneously formed on dice 214 of wafer 12.

In any of the above-described embodiments, the invention may be used in at least one of two ways: first, with the microcolumn as the primary tool and the scanning probe microscope as the secondary tool; or second, with the scanning probe microscope as the primary tool and the microcolumn as the secondary tool. For example, one application of apparatus 210 of FIG. 8 uses microcolumns 14 as the primary tool for patterning features on a sample or substrate. Peripheral scanning probe microscopes 16 are secondary tools for registration, to align microcolumns 14 with respective dice 214 of wafer 12, so that each microcolumn 14 patterns a precise area of wafer 12. In this case, peripheral scanning probe microscopes 16, which can be either STMs or AFMs, scan for alignment targets 118, which are located along the periphery of wafer 12. Peripheral scanning probe microscopes 16 provide position information which is then used to adjust the position of microcolumns 14 with respect to dice 214 of wafer 12. It should be noted that, as discussed above, that central scanning probe microscopes 16 can also be used to pattern areas of wafer 12.

An example of the second situation in which the scanning probe microscope is the primary tool is an imaging application in which highly localized information about the surface of a substrate is desired. Microcolumn 14 quickly scans the sample to find the area of interest. Once the area of interest is located, scanning probe microscope 16 focuses in and provides more detailed information about the area of interest.

In summary, embodiments of the present invention enable imaging with sub-nanometer resolution over several orders of magnitude in field size, lithography over a wide range of energies, from meV to keV, and high resolution localized analysis of materials. In lithography, the selection of a STM or AFM for scanning probe microscope 16 depends on the particular application. In addition, apparatus 10 may be used on a wide range of sample material, including metals, semiconductors and insulators.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, apparatus 10 may include a scanning probe microscope other than a STM, AFM or MFM. Other scanning probe microscopes include scanning acoustic microscopes, scanning capacitance microscopes, scanning thermal microscopes, scanning optical microscopes and scanning ion-conductive microscopes, to name a few.

What is claimed is:

1. An apparatus comprising:
   a support structure;
   a first electron beam microcolumn mounted on the support structure; and
   at least a probe of a first scanning probe microscope mounted on the support structure and associated with the first microcolumn.

2. The apparatus of claim 1 wherein the first microcolumn comprises:
   a positioner having a field emitter tip for emitting an electron beam;
   an objective lens for focusing the electron beam; and
   a deflector for scanning the electron beam across the wafer.

3. The apparatus of claim 1 further comprising a detector associated with the microcolumn.

4. The apparatus of claim 1 wherein the first scanning probe microscope is a scanning tunneling microscope.

5. The apparatus of claim 1 wherein the first scanning probe microscope is an atomic force microscope.

6. The apparatus of claim 1 further comprising a second microcolumn and at least a probe of a second scanning probe microscope mounted on the support structure, the second scanning probe microscope being associated with the second microcolumn.

7. The apparatus of claim 6 wherein the first and second scanning probe microscopes are scanning tunneling microscopes.

8. The apparatus of claim 6 wherein the first scanning probe microscope is a scanning tunneling microscope and the second scanning probe microscope is an atomic force microscope.

9. The apparatus of claim 8 wherein the support structure comprises a crystalline substrate in which a portion of the first microcolumn and the probe of the first scanning probe microscope are defined.

10. The apparatus of claim 1 further comprising an array of scanning probe microscopes associated with the first microcolumn.

11. The apparatus of claim 10 wherein at least one of the scanning probe microscopes at a center of the array is a scanning tunneling microscope.

12. The apparatus of claim 10 wherein at least one of the scanning probe microscopes along a periphery of the array is an atomic force microscope.

13. The apparatus of claim 1 wherein the support structure comprises a crystalline substrate in which a portion of the first microcolumn and the probe of the first scanning probe microscope are defined.

14. An apparatus comprising:

an array of electron beam microcolumns; and at least one scanning probe microscope associated with at least one microcolumn in the array of microcolumns.

15. The apparatus of claim 14 wherein each microcolumn of the array of microcolumns comprises:

a positioner having a field emitter tip for emitting an electron beam;

an objective lens for focusing the electron beam; and a deflector for scanning the electron beam across the wafer.

16. The apparatus of claim 14 wherein the at least one scanning probe microscope is a scanning tunneling microscope.

17. The apparatus of claim 14 wherein the at least one scanning probe microscope is an atomic force microscope.

18. The apparatus of claim 14 wherein each microcolumn in the array of microcolumns has an associated scanning probe microscope.

19. The apparatus of claim 18 wherein a plurality of the scanning probe microscopes are scanning tunneling microscopes and a plurality of the scanning probe microscopes are atomic force microscopes.

20. The apparatus of claim 19 wherein the array of microcolumns has a center and a periphery, the scanning tunneling microscopes being located at the center of the array, and the atomic force microscopes being located along the periphery.

21. The apparatus of claim 14 wherein a portion of the array of microcolumns and a probe of the at least one scanning probe microscope are defined in a crystalline substrate.

22. A method for inspecting and patterning a wafer, the wafer including a plurality of die areas, the method comprising:

providing an apparatus for surface inspection and microfabrication comprising:

an array of electron beam microcolumns, the array having a center and a periphery; and at least one scanning probe microscope associated with a microcolumn of the array of microcolumns;

placing the apparatus above the wafer such that each microcolumn of the array of microcolumns is situated above a respective die area of the wafer; and patterning the die areas of the wafer with the array of microcolumns.

23. The method of claim 22 wherein the at least one scanning probe microscope is located along the periphery of the array, and further comprising deriving a signal from the at least one scanning probe microscope to position the apparatus above the wafer.

24. The method of claim 23 wherein the at least one scanning probe microscope is an atomic force microscope.

25. The method of claim 22 wherein the at least one scanning probe microscope is located at a center portion of the array, and further comprising patterning the die areas of the wafer with the at least one scanning probe microscope.

26. The method of claim 25 wherein the at least one scanning probe microscope is a scanning tunneling microscope.

27. The method of claim 22 wherein each microcolumn of the apparatus has an associated scanning probe microscope, a plurality of the scanning probe microscopes located along the periphery of the array being atomic force microscopes, and a plurality of the scanning probe microscopes located at the center of the array being scanning tunneling microscopes, and further comprising:

deriving a signal from the atomic force microscopes to position the apparatus above the wafer; and patterning the die areas of the wafer with the scanning tunneling microscopes.

28. A method of operating on a sample comprising:

operating on a sample with an electron beam mounted on a support structure;

microscopically probing the sample with a probe mounted on the support structure and associated with the electron beam; and deriving a signal from the probe.

* * * * *